(12) United States Patent
LeBrun (10) Patent No.: US 8,433,543 B2
(45) Date of Patent: Apr. 30, 2013

(54) DIGITAL OSCILLOSCOPE MODULE WITH GLITCH DETECTION

(75) Inventor: Marco LeBrun, Florence (IT)

(73) Assignee: Service Solutions U.S. LLC, Warren, MI (US)

( * ) Notice: Subject to any disclaimer, the term of this patent is extended or adjusted under 35 U.S.C. 154(b) by 448 days.

(21) Appl. No.: 12/548,185

(22) Filed: Aug. 26, 2009

(65) Prior Publication Data

US 2010/0052653 A1 Mar. 4, 2010

Related U.S. Application Data

(60) Provisional application No. 61/091,891, filed on Aug. 26, 2008.

(51) Int. Cl.
*H03F 1/26* (2006.01)
*G06F 15/00* (2006.01)
*G01R 13/00* (2006.01)

(52) U.S. Cl.
USPC .............. 702/189; 701/29; 702/66; 702/67; 702/190

(58) Field of Classification Search ............. 702/66, 702/67, 70, 71, 79, 80, 106, 122, 125, 126, 702/176, 190, 197; 701/29; 204/192.13; 341/61; 704/500; 714/719
See application file for complete search history.

(56) References Cited

U.S. PATENT DOCUMENTS

| | | | |
|---|---|---|---|
| 4,802,098 A | 1/1989 | Hansen et al. | |
| 4,809,189 A | 2/1989 | Batson | |
| 6,025,833 A | 2/2000 | Duff | |
| 6,359,706 B1 | 3/2002 | Arita et al. | |
| 6,736,944 B2 | 5/2004 | Buda | |
| 7,071,852 B1 | 7/2006 | Wegener | |
| 7,157,886 B2 | 1/2007 | Agarwal et al. | |
| 7,206,722 B2 | 4/2007 | Pickerd et al. | |
| 7,885,781 B2 | 2/2011 | Cannon et al. | |
| 2002/0128786 A1* | 9/2002 | Alexander | 702/66 |
| 2003/0191995 A1 | 10/2003 | Abrosimov et al. | |
| 2003/0220753 A1* | 11/2003 | Pickerd et al. | 702/67 |
| 2004/0102879 A1* | 5/2004 | Raichle et al. | 701/29 |
| 2006/0074607 A1* | 4/2006 | Weller | 702/190 |
| 2008/0109229 A1 | 5/2008 | Suzuki | |
| 2010/0057388 A1* | 3/2010 | LeBrun | 702/67 |

OTHER PUBLICATIONS

International Search Report for PCT/US09/055074 mailed Oct. 22, 2009.
International Search Report for PCT/US09/055076 mailed Oct. 13, 2009.

* cited by examiner

*Primary Examiner* — John H Le
(74) *Attorney, Agent, or Firm* — Baker & Hostetler LLP (57) ABSTRACT

The present invention provides a digital oscilloscope with glitch detection, including a synchronous random access memory (RAM), a digital signal processing unit, coupled to the synchronous RAM, and a master control unit coupled to the digital signal processing unit. The digital signal processing unit includes an analog-to-digital (A/D) converter to digitize an analog signal and a digital signal processor. The digital signal processor includes a dual-port RAM, a plurality of processing blocks to process the digitized analog signal data, detect glitches in the digitized analog signal data, store the processed signal data in the synchronous RAM, create display data from the stored signal data, and store the display data in the dual-port RAM, and a communications interface to transmit the stored display data. The master control unit includes an internal communications interface coupled to the digital signal processor communications interface, an external communications interface, and a central processing unit to receive the display data over the internal communications interface and transmit the display data over the external communications interface.

20 Claims, 3 Drawing Sheets

DIGITAL OSCILLOSCOPE MODULE WITH GLITCH DETECTION

CROSS-REFERENCE TO RELATED APPLICATIONS

This application claims priority to U.S. Provisional Patent Application Ser. No. 61/091,891, filed on Aug. 26, 2008, the disclosure of which is incorporated herein by reference in its entirety.

FIELD OF THE INVENTION

The present invention relates generally to diagnostic equipment. More particularly, the present invention relates to a digital oscilloscope module with glitch detection.

BACKGROUND OF THE INVENTION

A digital oscilloscope samples analog signals at a very high rate and stores the data in a RAM buffer for display on a display screen. In some architectures, a dedicated data acquisition subsystem acquires the data, and a display subsystem hosts the user interface and displays the data to the user. In these architectures, the display subsystem may be hosted by a standard personal computer, while the digital data acquisition subsystem may be an external module or "black box" connected to the personal computer via a high-speed communications link.

In a typical display subsystem, a large buffer size allows a large number of samples to be stored, which provides more details for display, such as for a "data zooming" feature. Generally, these architectures tradeoff the number of samples transferred to the display subsystem against display refresh rate. For example, if a very fast communication link is used, such as USB 2.0 "high speed," a large number of samples can be transferred at an acceptable rate (e.g. 500,000 samples of 16 bits at 10 waveforms per second). Unfortunately, high-speed data transfer requires expensive components and commensurately high processing power on the display subsystem. Conversely, if a moderate or slow speed communication link is used, such as, for example, USB 1.1 or USB 2.0 "full speed," RS-232, WiFi, Bluetooth, etc., the number of samples that can be transferred at an acceptable refresh rate is much more limited, and data may not be acquired, transferred and displayed at the desired rate.

Furthermore, a typical application of a digital oscilloscope is the detection of an irregularity in a train of pulses. Such irregularity, usually called a "glitch," can consist of a missing pulse or an extra pulse or a bad shaped pulse. In a vehicular diagnostic context, pulse trains may include injector pulses, primary ignition pulses, phase sensors, TDC sensors, as well as many others. Usually, a glitch in these signals indicates a malfunction. Such failures are often sporadic and difficult to detect, as they may appear only at specific speed or load conditions. The ability of the digital oscilloscope to detect and capture glitches, while minimizing false alarms, is therefore important in order for the diagnostic process to be useful. One of the problems that affect current devices is the difficulty associated with changes in frequency, which is a normal behavior of the signal in case of accelerations or decelerations.

Accordingly, it is desirable to provide a digital data acquisition module that maintains provides improved glitch detection, full zooming capabilities and a fast refresh rate while operating over a slow or moderate speed communication link.

SUMMARY OF THE INVENTION

Embodiments of the present invention provide a digital oscilloscope with glitch detection that includes a synchronous random access memory (RAM), a digital signal processing unit, coupled to the synchronous RAM, and a master control unit coupled to the digital signal processing unit. The digital signal processing unit includes an analog-to-digital (A/D) converter to digitize an analog signal and a digital signal processor. The digital signal processor includes a dual-port RAM, a plurality of processing blocks to process the digitized analog signal data, detect glitches in the digitized analog signal data, store the processed signal data in the synchronous RAM, create display data from the stored signal data, and store the display data in the dual-port RAM, and a communications interface to transmit the stored display data. The master control unit includes an internal communications interface coupled to the digital signal processor communications interface, an external communications interface, and a central processing unit to receive the display data over the internal communications interface and transmit the display data over the external communications interface.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
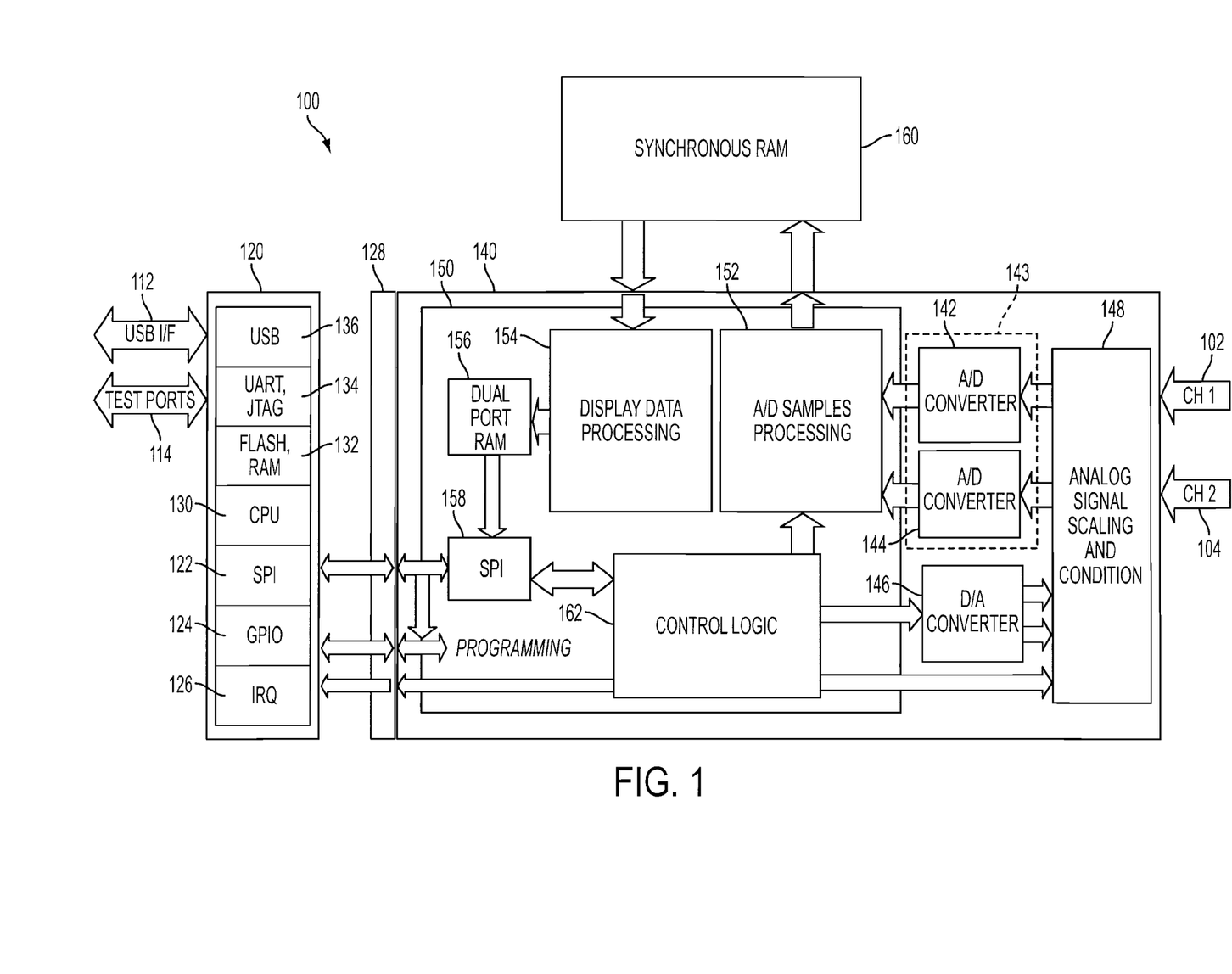
FIG. 1 is a schematic block diagram illustrating a digital oscilloscope module, in accordance with an embodiment of the present invention.

FIG. 1 is a schematic block diagram illustrating a digital oscilloscope module 100, in accordance with an embodiment of the present invention. Digital oscilloscope module 100 measures one or more analog signals 102, 104, and provides associated display data to a host display subsystem over a communications interface, such as USB I/F 112. Digital oscilloscope module 100 generally includes a master control unit (MCU) 120, a digital signal processing unit (DSPU) 140, and a synchronous random access memory (RAM) 160, electrically coupled to one another in order to exchange data and control signals, power, etc. In various embodiments, digital oscilloscope module 100 may also function as a digital multimeter (DMM). Master control unit 120, digital signal processing unit 140 and synchronous RAM 160 are disposed on one or more circuit boards that are enclosed within a housing (not shown) whose physical form factor, interface connection locations, etc., may be advantageously optimized and adapted for use with a handheld signal analyzer, such as, for example, SPX Service Solutions' Pegisys™ handheld vehicle scan tool. In other embodiments, the housing may be a generic, small form-factor electronic device housing, such as for a ubiquitous USB device, for example.

Master control unit 120 generally includes a central processing unit (CPU) 130, non-volatile (flash) memory and/or RAM 132, various external interfaces that provide power, data signals, control signals, etc., such as, for example, a USB device 136, a universal asynchronous receiver/transmitter (UART) and/or a joint test action group (JTAG) test access port(s) 134, etc., and various internal interfaces to the digital signal processing unit 140 that similarly provide power, data signals, control signals, etc., such as, for example, a serial peripheral interface (SPI) 122, a general purpose input/output (GPIO) 124 interface, an interrupt request (IRQ) signal interface 126, etc. In one embodiment, at least the SPI 122 signals may pass through galvanic isolation 128, such as, for example, Avago HCPL-092J high-speed digital isolators, in order to improve isolation.

In a preferred embodiment, master control unit 120 is an Atmel AT91SAM7S64, which contains an ARM7 core, USB device and fast SPI and direct memory access (DMA). In this embodiment, a 16 MHz crystal is internally multiplied to generate 96 MHz from a phased-locked loop (PLL), which is divided by 2 to generate the 48 MHz clock for CPU 130 and USB device 136. In one embodiment, the 96 MHz clock is also divided by 4 to output a 24 MHz clock to digital signal processing unit 140, while in another embodiment, a 16 MHz clock is provided to digital signal processing unit 140. In alternative embodiments, an ST STR750F, or other similar processor, may be employed.

Digital signal processing unit 140 generally includes a digital signal processor 150, such as, for example, a field programmable gate array (FPGA), analog signal scaling and conditioning circuits 148, at least one analog-to-digital (A/D) converter 142, at least one digital-to-analog (D/A) converter 146, and an interface to synchronous RAM 160. In a preferred embodiment, digital signal processing unit 140 includes two A/D converters 142, 144, coupled to analog input signal channels 102, 104, and a single D/A converter 146; other permutations are contemplated by the present invention.

Generally, synchronous RAM 160 buffers the data acquired by the digital signal processing unit 140. In one embodiment, the size of synchronous RAM 160 is 256 K words of 36-bits. The bit-mapping within each word may be advantageously adjusted based upon the operating mode of the digital oscilloscope module 100. For example, in an average mode, each 36-bit word uses 32 bits to store 16 bits of data for each channel, while in an envelope mode, each 36-bit word uses 36 bits to store 9 bits of minimum data and 9 bits of maximum data for each channel. Increased storage capacity, such as storage for 512 K words of 36-bits, 1 M words of 16-bits, etc., is also contemplated by the present invention. Rings buffers may be advantageously employed within synchronous RAM 160.

In a preferred embodiment, a zero bus turnaround (or no bus turnaround) flow through SRAM is used to allow interleaved read and writes without "dead" clock cycles. The speed of the SRAM may be 12.5 ns or better, and supports these interleaved read and write cycles at a clock frequency of 80 MHz, e.g., 40 M read cycles per second and 40 M write cycles per second. Synchronous RAM 160 may be write-controlled by the A/D samples processing block 152 of the digital signal processor 140, and read-controlled by the display data processing block 154 of the digital signal processor 140. In a preferred embodiment, synchronous RAM 160 is an IDT71V65703S85, with 8.5 ns access time.

Within the digital signal processing unit 140, analog signal scaling and conditioning circuits 148 generally include components that scale and condition each analog input signal, as well as associated switching and control circuitry. In one embodiment, analog signal scaling and conditioning circuits 148 may include an input divider, an AC/DC signal selector, a measurement/calibration mode selector, a buffer, such as an AD8033AR operational amplifier, one or more multiplier sections that adjust the incoming analog signal voltages to the best value for the A/D converter(s), an offset section that provides the correct voltage offset value to the A/D converter(s), an anti-aliasing filter, etc. In a preferred embodiment, the anti-aliasing filter is a Sallen Key filter.

Figure 2:
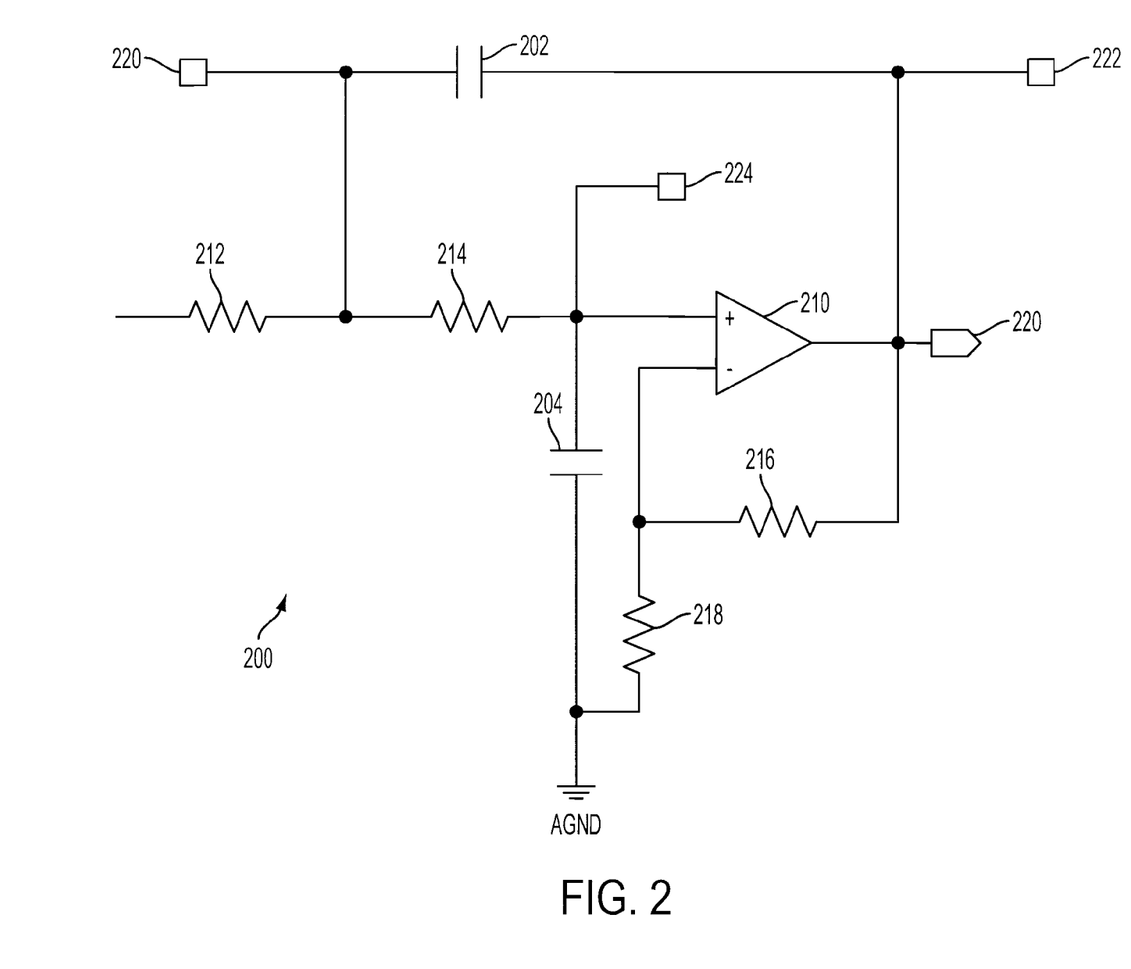
FIG. 2 is a schematic diagram illustrating an anti-aliasing filter, in accordance with an embodiment of the present invention.

FIG. 2 is a schematic diagram illustrating an anti-aliasing filter 200, in accordance with an embodiment of the present invention. In one embodiment, anti-aliasing filter 200 is a second order, low-pass filter based on a voltage feedback amplifier with a passive feedback RC network. The cutoff frequency is typically no more than half the sample rate of the A/D converter 142 (144), and, in a preferred embodiment, the cutoff frequency is about 20 MHz. In this embodiment, anti-aliasing filter 200 includes an operational amplifier 210, such as a National Semiconductor LNH6682MA, a net ANALOG-4A 220 coupled to the negative input of A/D converter 142 (144) through a 100 ohm resistor (not shown), capacitor 202 (e.g., about 80 pF), capacitor 204 (e.g., about 8 pF), resistor 212 (e.g., about 100 ohms), resistor 214 (e.g., about 1 Kohms), as well as optional resistors 216, 218. Various test points 220, 222, 224 may also be provided.

Returning to the digital signal processing unit 140 depicted in FIG. 1, A/D converters 142, 144 are generally fast, 8-bit to 16-bit, 40 Msps (mega-samples-per-second) devices. In a preferred embodiment, A/D converters 142, 144 are provided within a single, two-channel A/D converter 143, such as the 12-bit Linear Technology LTC2292. A/D converter 143 may be used in differential mode as well as single ended mode, which is preferred. In this embodiment, the mid-range input voltage is 1.5V and input swing is from 0.5 V to 2.5 V. The analog conditioning circuitry 148 scales and offsets the input analog signal to the 0.7 V to 2.3 V range at the input of the A/D converter 143, corresponding to 80% of the range. This advantageously allows some margin in setting hardware gain and offset in a coarse way, allowing precise correction factors to be based on various calibration parameters.

Generally, D/A converter 146 is a multi-channel, 8-bit device that sets an offset independently for each of the analog input channels. In a preferred embodiment, A/D converter 146 is a two-channel, 8-bit device, such as the National Semiconductor DAC082S085. The offset advantageously sets the polarity of the input range, such as, for example, positive only, symmetrical positive and negative, negative only, and provides coarse zero offset adjustment in order to position the input signal within 80% of the A/D input range. A finer adjustment is also contemplated by the present invention.

Digital signal processor 150 provides real time data acquisition, filtering and buffering functions, and generally includes an A/D samples processing block 152, display processing block 154, control logic block 162, dual-port RAM 156, one or more interfaces including SPI interface 158, IRQ lines, etc., flags, registers, internal clock circuits, etc. In a preferred embodiment, digital signal processor 150 is an FPGA, such as the Altera Cyclone II part EP2C15F256C8 programmed in VHDL. A development environment, such as the Altera Quartus development environment, may facilitate programming, for example. In this embodiment, digital signal processor 150 is dynamically configured by the master control unit 120 using data received from the host display system at runtime, using, for example, various data and control signals provided by the SPI interface 158, etc.

Generally, digital signal processor 150 includes one or more phase-locked loop (PLL) circuits (not shown) to synthesize one or more internal clock signals. In one embodiment, digital signal processor 150 includes a first PLL that is fed by the 16 MHz clock signal from MCU 120 to generate an 80 MHz clock, as well as a second PLL that generates a second 80 MHz clock signal that may be synchronized, in phase and frequency, to the first clock signal. Preferably, the first clock signal is provided to synchronous RAM 160, which then returns the signal to digital signal processor 150 for synchronization.

In one embodiment, SPI interface 122 of MCU 120 connects to SPI interface 158 of digital signal processor 150, and supports programming as well as data exchange. In this embodiment, three digital lines are used for communication, i.e., a clock (SCLK), a master out slave in (MOSI) and master in slave out (MISO). Galvanic isolation, as described above, may be implemented on the digital lines. While SPI interface 158 generally has a maximum data rate of 100 Mbps, in this embodiment, the data transfer speed is 12 Mbps and the word size is 16-bits. Advantageously, SPI interface 158 is internally implemented within digital signal processor 150, so that MOSI and SCLK are internally synchronized with the main 80 MHz clock and MISO output is synchronized with the incoming SCLK.

Control logic block 162 provides an interface between CPU 130 of MCU 120 and the other processing blocks, as well as several of the other components, within digital signal processor 150. In one embodiment, control logic block 162 supports various memory-mapped flags and registers that are accessible by CPU 130 over various interfaces, such as IRQ 126, GPIO 124, SPI 122, etc. In a preferred embodiment, each memory-mapped register is 16-bits and the address space is 16K words; the 8K of the address space contains individual registers, while the second 8K of the address space contains the dual-port RAM 156. The analog signal scaling and conditioning circuitry 148 may also be controlled via registers that drive digital output lines. Similarly, digital output lines may drive A/D converters 142, 144 and synchronous RAM 160. Burst mode reading of the dual-port RAM 156, via SPI interface 158, is also contemplated.

In a preferred embodiment, dual-port RAM 156 contains display data that are directly accessible by CPU 130. In the embodiment discussed above, dual-port RAM 156 may contains 8K words of 16-bit data. These data are read from synchronous RAM 160 by display data processing block 154 and transferred to dual port RAM 156, where the data are read by MCU 120, over the SPI interface 158, and sent to USB I/F 112 through USB device 120. Various data storage strategies are contemplated, such as, for example, two ping-pong buffers to send data from one buffer to the host display subsystem while the other buffer is filled by the display data processing block 154, four buffers that are filled in with MIN and MAX data arrays from the two channels, data decimation reduction by reusing the buffer rather than consecutive synchronous RAM 160 areas, etc. Advantageously, sending more data per horizontal display pixel allows the host user interface to implement analog-like display with color shading.

Figure 3:
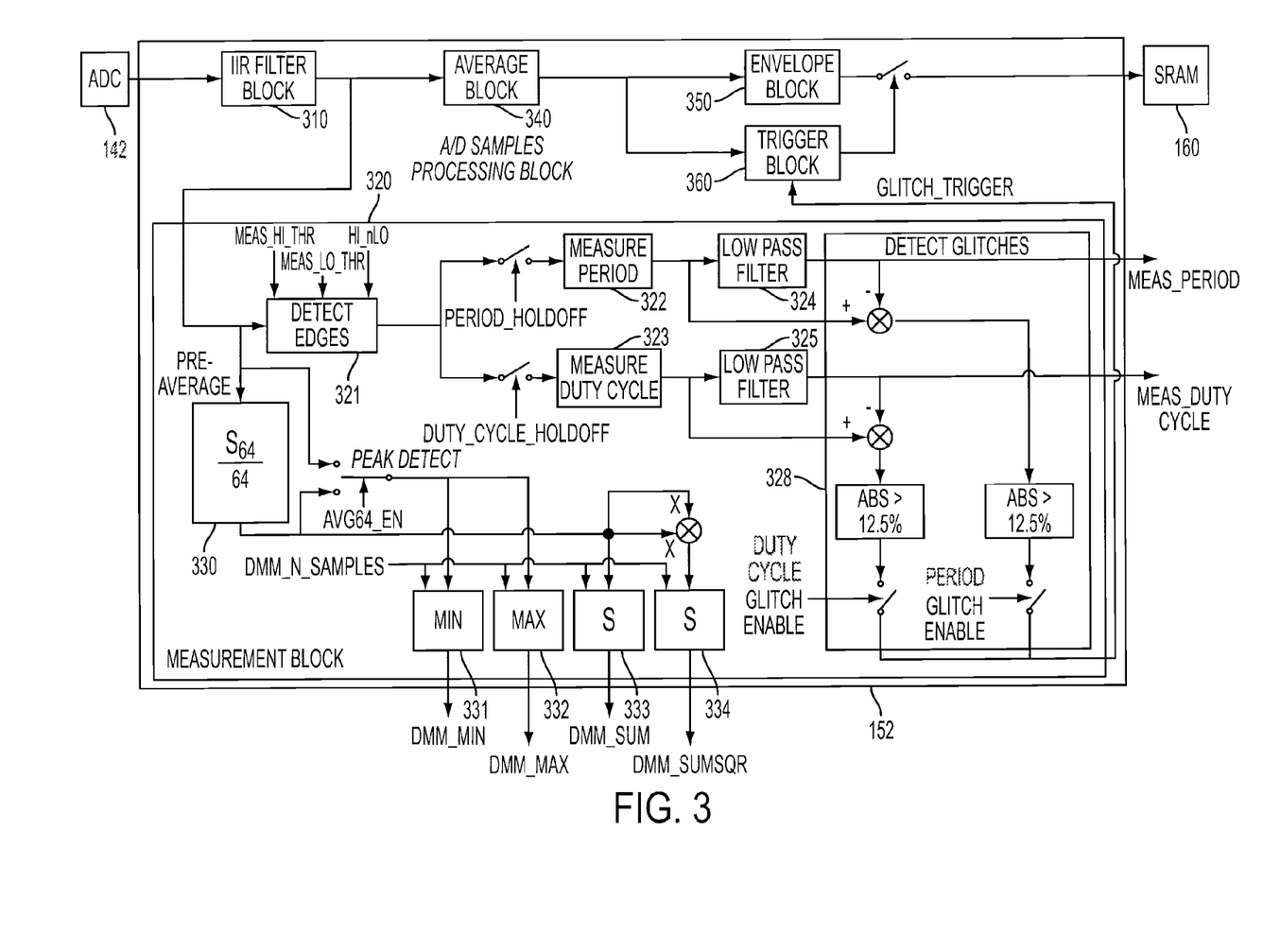
FIG. 3 is a schematic diagram illustrating a sample processing block, in accordance with an embodiment of the present invention.

A/D samples processing block 152 generally includes an infinite impulse response (IIR) filter, measurement, average, envelope and trigger detection functions, as depicted in FIG. 3, for example. In one embodiment, IIR filter block 310, measurement block 320, average block 340 and envelope block 350 are instantiated twice (i.e., once per channel), and may have independent settings, particularly when the output frequency of the last block (envelope) is the same for both channels. Trigger block 360 is typically instantiated once and is connected to one of the two channels, although other permutations are contemplated.

In a preferred embodiment, data are written to a ring buffer in synchronous RAM 160 under control of three registers: SRAM write address register, SRAM write buffer start register, SRAM write buffer end register. The 19-bit SRAM write address register is initially set to the first address, e.g., an even address, and is incremented during the process. The 19-bit SRAM write buffer start and SRAM write buffer end registers implement a ring buffer; for example, if the SRAM write address register reaches SRAM write buffer end, it is reset to SRAM write buffer start. The ring buffer is continuously written until the acquisition is ended. The SRAM write address register may be read in order to determine at which address the oldest and latest data are located within the ring buffer. An SRAM write overflow counter register is incremented every time the SRAM write address rolls back to SRAM write buffer start, in order to determine how many samples have been acquired, if the buffer has been filled at least once with good data to display, etc.

In one embodiment, IIR filter block 310 provides noise reduction and inverse resolution of the sample data. In a preferred embodiment, two IIR filter blocks 310 are instantiated, one for each channel, according to the following function:

$$y(t)=(a(x(t)*2^5)+by(t-1)+cy(t-2))/2^{16}$$

where 'x' is the 12 bit unsigned input from the A/D converter to the filter, 'y' is the 18 bit signed output, and 'a', 'b' and 'c' are 18-bit, signed constants. The constant divisor ($2^{16}$, implemented by ignoring the 16 lower order bits of the result) allows for filter coefficients ("$a/2^{16}$", "$b/2^{16}$" and "$c/2^{16}$") in the range [−2 . . . +2).

In a preferred embodiment, two average blocks 340 are instantiated, one for each channel. Each average block 340 is fed by an output of an IIR filter block 310 (18-bits signed), and accumulates $N_{avg}+1$ input data in a 34-bit signed accumulator ($A_{avg}$), delivering an output sample with a frequency of $40/(N_{avg}+1)$ Msps. Preferably, $A_{avg}$ is cleared at every cycle. $N_{avg}$ is set to a value between 0 and 65535 (0 meaning that no average is carried out). At the end of each cycle, $A_{avg}$ is shifted right by n bits, where n is 1 if $N_{avg}$ is 0, otherwise 2+the order of the rightmost bit of $N_{avg}$ set to 1, for example, if $N_{avg}$ is 1 n would be 2, if $N_{avg}$ is 2 or 3 n would be 3, if $N_{avg}$ is 32768 to 65535 n would be 17. This guarantees maximum resolution without overflows, and n is automatically calculated by the digital signal processor 150. The 16-bit unsigned number obtained after shifting $A_{avg}$ goes then through a hardware multiplier to generate the 16 bits unsigned result of average block 340. The multiplying factor multavg is a 16 bit unsigned register that is set to compensate for the scale reduction when $N_{avg}+1$ is not a power of two. multavg is typically in the range 0x8000 (=unity gain) to 0xFFFF (×2 gain).

In a preferred embodiment, two envelope blocks 350 are instantiated, one for each channel. Envelope block 350 provides various functions, such as, for example, "peak detect, "particularly for slow time scales. Envelope block 350 is fed by the output of an average block 340 (16 bit unsigned), and, similar to average block 340, envelope block 350 operates in cycles of $N_{env}+1$ samples, delivering an output sample with a frequency of $40/((N_{avg}+1)*(N_{env}+1))$ Msps. Two 16-bit registers hold the maximum and minimum of the input values: $M_{env}$ and $m_{env}$, that are initialized at the beginning of each cycle respectively with 0 and FFFFh. $N_{env}$ is set to a value between 0 and 65535. The output of the envelope block 350 is $M_{env}$ and $m_{env}$; if $N_{env}=0$ the output $m_{env}$ equals $M_{env}$. One write cycle to synchronous RAM 160 is carried out every time $M_{env}$ and $m_{env}$ are output from the envelope blocks and the SRAM write address register is incremented by 1. If $N_{env}$ is 0 for both channels, $M_{env}$ is written on 16 bits; if $N_{env}$ is not 0, both $M_{env}$ and $m_{env}$ are written as 9 bits values in a 18 bits word, discarding the lower 7 bits. Typically, only 3 of those 7 bits are significant, as when envelope mode is in use the 12 bits of the A/D converter 142, 144 would be transferred to the envelope block 350 directly without filtering or averaging. In one embodiment, $(N_{avg}+1)*(N_{env}+1)$ is the same for channel 1 and channel 2 to allow for different decimation strategies for the two channels (e.g. average one and envelope the other). In this embodiment, the overall decimation rate is the same.

Generally, trigger block 360 may be connected to the output of average block 340 of channel 1 or 2. The trigger may be set to detect rising edges, falling edges, high pulses, low pulses and glitches. In a preferred embodiment, two 16-bit registers store the high and low threshold for the trigger (TH and TL). For pulse detect modes, a 32 bit register holds the time threshold (TT) for the pulse length. Trigger by longer or shorter pulses may also be selected, and a 32-bit counter running at 40 MHz is used to evaluate the pulse width. In a preferred embodiment, several registers may be implemented, such as, for example, a 19-bit post trigger register that defines the position of the trigger with respect to the end of the acquisition, a 19 bit min pre-trigger register that defines the minimum number of samples before a trigger can occur, a 32 bit trigger holdoff register that defines a minimum delay between trigger events, a 32 bit trigger timeout register that defines a maximum delay between trigger events, a 19 bit trigger position register that stores the SRAM address corresponding to the trigger event, a 32 bit trigger timestamp register that stores the value of a 40 MHz free running counter corresponding to the trigger event, etc.

In this embodiment, a rising edge is detected when $A_{avg}>=TH$ after being $<=TL$. A falling edge is detected when $A_{avg}<=TL$ after being $>=TH$. A short high pulse trigger is detected when a rising edge is followed by a falling edge within TT. A long high pulse trigger is detected when a rising edge is followed by a falling edge after TT. A short low pulse trigger is detected when a falling edge is followed by a rising edge within TT. A long low pulse trigger is detected when a falling edge is followed by a rising edge after TT. Notably, a glitch trigger is detected by measurement block 320.

In one embodiment, acquisition is started when a start acquire bit in a trigger control register is set, which initiates a 19 bit pre trigger countdown with the value stored in the min pre trigger register. The pre trigger countdown register is decremented every time the synchronous RAM 160 is written until the register reaches 0. Trigger is only enabled when the pre trigger countdown register is 0. The min pre trigger register is set to guarantee that enough data are acquired to fill the display screen. When a trigger is detected, the current SRAM write address register is saved in the trigger position register, the value of a 40 MHz free running counter is saved in the trigger timestamp register, and a 19 bit post trigger countdown register is initiated with the value stored in the post trigger register. The post trigger countdown register is decremented each time the SRAM is written. When the countdown register reaches zero, an interrupt is generated and further SRAM writes are inhibited by resetting the acquire bit, until a new acquisition cycle is started. In this idle condition acquisition and averaging remain active, to allow proper trigger holdoff operation.

In this embodiment, when the trigger is detected, a 32 bit holdoff countdown register is initiated with the value stored in the trigger holdoff register. The holdoff countdown register is decremented at 40 MHz, and allows further triggering only after reaching zero. Single shot or normal mode are supported with a proper management of the start acquire bit. Automatic mode is activated by setting the auto mode bit in the trigger control register, and is implemented with a 32 bit timeout count register that is initiated with the value stored in the trigger timeout register at every trigger event. The timeout count register is decremented at 40 MHz and forces a trigger upon reaching 0. When a trigger is generated by the timeout counter, a forced trigger bit is set in the trigger position register. In a preferred embodiment, a glitch trigger, provided by measurement block 320, has priority over the other triggers. For example, if the glitch trigger is enabled together with another type of trigger, both triggers will be detected and start the post trigger countdown. If the post trigger countdown was started by a normal trigger and a glitch trigger arrives before the countdown expires, the countdown will be restarted, so that the glitch trigger takes priority.

In a preferred embodiment, two measurement blocks 320 are instantiated, one for each channel. Similar to the trigger block 360, measurement block 320 detects rising and falling edges and high and low pulses. Measurement block 320 integrates time measurement, such as, for example, period and duty cycle, and voltage measurement, such as, for example, minimum, maximum, average and rms values, as noted above. Measurement block 320 also performs glitch detection and generates a trigger pulse when an abrupt change in frequency and/or duty cycle is detected. Generally, measurement block 320 includes various processing blocks, such as, for example, a detect edges block 321, a measure period block 322, a measure duty cycle block 323, low-pass filter blocks 324, 325, a detect glitches block 328, a pre-average block 330, and various other measurement blocks, such as a minimum block 331, a maximum block 332, a sum block 333 and a squared sum block 334.

As depicted in FIG. 3, measurement block 320 is fed by the output of an IIR filter 310. In this embodiment, the samples fed to measurement block 320 follow two separate paths, one for time measurements and one for voltage measurements. In a preferred embodiment, the time base for time measurements is a 32-bit 40 MHz free running counter. A 32 bit period counter holdoff register and 32 bit duty cycle counter holdoff register (written to by software) may be used to improve reading stability and to allow measurements on complex waveforms. These register values may be predetermined, or, alternatively, these register values may be obtained, for example, from a spectrum analysis of an input waveform. Falling or rising edges may be selected as starting events for frequency and duty cycle measurement. When an edge of the selected type is detected, at detect edges block 321, and the free running counter is higher than the period counter holdoff, the content of the free running counter is fed further as the instantaneous period measurement and the counter is reset. When an edge of the opposite type is detected and the free running counter is higher than the duty cycle counter holdoff, the content of the free running counter is fed further as the instantaneous duty cycle measurement. The signal is then processed by first order low pass filters 324, 325. In one embodiment, these contain a 36-bit average value of the measurement, and, at every new measurement, the average values are updated as follows:

$$\text{Period\_average}_{n+1} = \frac{15}{16}\text{Period\_average}_n + \text{Period\_measured}_n$$

$$\text{Dutycycle\_average}_{n+1} = \frac{15}{16}\text{Dutycycle\_average}_n + \text{Dutycycle\_measured}_n$$

The time constant of low pass filters 324, 325 depends on the waveform period "T" and, in one embodiment, corresponds to 15.5T. The higher 32 bits of the average values approach the period and duty cycle measures, and may be transferred to a 32 bit period measurement register and a 32 bit duty cycle measurement register. The instantaneous and average measures of period and duty cycle are also compared to detect glitches, such as, for example, missing pulses, at detect glitches block 328, and a glitch trigger signal may be generated.

According to this aspect of the invention, an automatic frequency tracking mechanism is provided that advantageously distinguishes a regular change in frequency of the input signal from an abrupt change in period or duty cycle indicative of a glitch. As discussed above, measurement block 320 includes selectable thresholds and hold off times to reliably detect rising and falling edges, as well as to calculate signal frequency and duty cycle. Low-pass filters 324, 325, applied to the frequency and duty cycle measurements, advantageously increase measurement stability. In a preferred embodiment, detect glitches block 328 compares the instantaneous values of frequency and duty cycle to the filtered values, and, if the absolute value of the difference is larger than a set percent threshold, such as, for example, 12.5%, a glitch event is signaled to trigger block 360 for further processing. In one embodiment, the glitch trigger signal is only active if GLITCH_MODE is selected in the trigger block. In a preferred embodiment, only glitches from a single channel (CH1 or CH2) are active at one time, depending on the channel selected in the trigger block. Other variations are contemplated by the present invention.

Generally, as the filtered values follow the changes in frequency and duty cycle more slowly than the instantaneous values, there will be a difference between the two that will normally remain within the threshold limits. An abrupt change in frequency or duty cycle will cause a larger difference that will be advantageously detected as a glitch. Additionally, detection of changes in frequency and/or duty cycle may be selectively enabled. Glitch sensitivity with respect to frequency or duty cycle may be adjusted by changing the thresholds for the differences, while glitch sensitivity with respect to pulse shape may be adjusted by setting the thresholds for the edge detection. For example, in one embodiment, there are two thresholds such that an edge is detected when the signal falls below the lower threshold and then rises above the high threshold (or vice-versa)—the closer the thresholds are to the maximum and minimum values, the higher is the sensitivity to changes in shape of the pulses.

In a preferred embodiment, voltage measurement may be carried out over blocks of samples, and a 16-bit dmm N samples register is set to the number of samples of the block. Typically, the number of samples may be set to cover a period of 100 ms, for example. In order to achieve the required sampling period, pre-average block 330 adds 64 samples and outputs the sum, divided by 64, at a rate that is 1/64 of the original input rate. Various voltage measurements may then be performed, such as, for example, minimum block 331, maximum block 332, sum block 333, and sum of squares block 334. In this embodiment, at the end of every block of dmm N samples, the output values are updated and the internal registers and accumulators are initialized for a new measuring cycle. Minimum and maximum are returned in the dmm_min and dmm_max 16-bit registers, while the sum is returned in the 32 bit dmm_sum register and may be used to calculate the average voltage by dividing by the number of samples and subtracting the zero offset. In one embodiment, the sum of squares is internally calculated in a 48 bit accumulator, but only the higher 32 bits are read in the dmm_sumsqr register. Accuracy is advantageously not reduced, as a zero volt input corresponds to half of the ADC the scale: 0x8000 from the average block, whose square is 0x08000000, so the lower 16 bits only account for 0.05%/N_SAMPLES. Even if a waveform is placed in the lower part of the used A/D converter range (e.g., 4.3% to 95.7%), the lower 16 bits would account for 0.8%/N_SAMPLES. The sum of squares can be used to determine the rms value with respect to a base value that can be the zero offset if only the DC component is desired, or the average value returned by the sum (above), if only the AC components are desired. For example, in the second case, the calculation may be:

$$\text{ValueRMS} = \frac{\sqrt{\text{Nsamples} \cdot (\text{dmm\_sumsqr} << 16) - \text{dmm\_sum}^2}}{\text{Nsamples}}$$

Generally, display data processing block 154 extracts data from synchronous RAM 160 and processes these data for eventual display to the user. The number of samples to be displayed is reduced according to the display size and the communication bandwidth provided between the MCU 120 and the host display subsystem. In one embodiment, this reduction may be accomplished by taking the maximum and minimum of a number of samples (so obtaining an "envelope" of the waveform) or by averaging them (so obtaining a "smooth" display). As discussed above, acquisition continues while data are displayed by using two buffers within synchronous RAM 160 in a "ping-pong" configuration. When the user stops or freeze the acquisition, the full data buffer is preserved in RAM allowing zooming into fine details. Registers control the zooming level and the offset position in the buffer to show exactly what the user desires.

In a preferred embodiment, display data processing block 154 includes a display average block and display envelope block, each of which is instantiated once for each channel. The DISP_PROC bit in the SRAM_READ_CNT_HI register is set by the MCU 120 to start the display process and remains high until the end of the process. Generally, the display data process copies and decimates data from the synchronous RAM 160 to the dual-port RAM 156 for a programmed number of samples. For example, in a preferred embodiment, 128K samples are read from synchronous RAM 160 at 40 MHz. The synchronous RAM 160 read process is controlled by several registers, such as, for example, an SRAM read address register, an SRAM read counter, an SRAM read buffer start register, and an SRAM read buffer end register. The 19-bit SRAM read address register is initially set to the first address and is incremented at each read during the process. The 19-bit SRAM read counter is initially set with the number of SRAM cells to be read −1 and is decremented during the process. An interrupt is generated to MCU 120 when the process is complete. The 19-bit SRAM read buffer start and SRAM read buffer end registers implement a ring buffer such that if the SRAM read address register reaches the SRAM read buffer end register, it is reset to SRAM read buffer start.

The display average block aggregates the desired number of samples from the synchronous RAM 160 into a buffer of the same or smaller size. In one embodiment, the reduction factor does not need to be integer and is given by the ratio $Rd_{avg}=(Nd_{avg}+1)/(Nddiv_{avg}+1)$, where $Nd_{avg}$ is set to a value between 0 and 16383, and $Nddiv_{avg}$ is set to a value between 0 and 1023 and $<=Nd_{avg}$. Here, when $Nd_{avg}=Nddiv_{avg}$, then no average is carried out. For each sample to be output, the display average block reads and accumulates a number of contiguous data from the synchronous RAM 160 for the selected channel and for the selected array of data, such as, for example, MAX or MIN values. The amount of data is equal to the reduction factor $Rd_{avg}$, if that value is an integer. On the other hand, if the value of the reduction factor is not integer, the amount of data read may vary between the lower and the higher integers. In order to calculate the sum on the same number of samples $\lceil Rd_{avg} \rceil$ (smallest integer$>=Rd_{avg}$), in one embodiment, the last sample of one cycle may be used twice, as well as for the first sample of next cycle. Data are accumulated in a 30-bit unsigned accumulator ($Ad_{avg}$) that may be cleared at every cycle. At the end of each cycle, $Ad_{avg}$ is shifted right by n bits where n is 0 if $Rd_{avg}$ is 1 otherwise 1+the order of the rightmost bit of $\lceil Rd_{avg} \rceil - 1$ set to 1: for example, if $\lceil Rd_{avg} \rceil$ is 2 n would be 1; if $\lceil Rd_{avg} \rceil$ is 3 or 4 n would be 2; if $\lceil Rd_{avg} \rceil$ is 8193 to 16384 n would be 14. The 16 bits unsigned number obtained after shifting $Ad_{avg}$ goes through a hardware multiplier to generate the 16 bits unsigned result of the display average block. The multiplying factor $multd_{avg}$ is a 16 bit unsigned register that is set to compensate for the scale reduction when $\lceil Rd_{avg} \rceil$ is not a power of two, and is typically in the range 0x8000 (=unity gain) to 0xFFFF (×2 gain).

The display envelope block may provide various functions, such as, for example, "peak detect" when a horizontal pixel of the display represents more data. The display envelope block is fed by the output of the display average block (16 bit unsigned). In one embodiment, one or more 16-bit registers hold the maximum and/or the minimum of the input values, depending on the status of the DISP_MAX bit in the SRAM_READ_CNT_HI register. The output of the display envelope block is stored in the dual-port RAM 156, starting from the address specified in the 13 bit DPRAM write address register. The number of words written to the dual-port RAM 156 depends on the SRAM read buffer length register, $Nd_{avg}$, $Nddiv_{avg}$, $Nd_{env}$ and $Nddiv_{env}$. By setting $Nd_{avg}=Nddiv_{avg}$ and $Nd_{env}=Nddiv_{env}$ the synchronous RAM 160 contents may be read transparently for testing and debugging purposes.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A digital oscilloscope with glitch detection, comprising:
   a synchronous random access memory (RAM);
   a digital signal processing unit, coupled to the synchronous RAM, including:
      an analog-to-digital (A/D) converter to digitize an analog signal; and
      a digital signal processor, including:
         a dual-port RAM;
         a plurality of processing blocks to process the digitized analog signal data, detect glitches in the digitized analog signal data, store the processed signal data in the synchronous RAM, create display data from the stored signal data, and store the display data in the dual-port RAM; and
         a communications interface to transmit the stored display data; and
   a master control unit, coupled to the digital signal processing unit, including:
      an internal communications interface coupled to the digital signal processing unit communications interface;
      an external communications interface; and
      a central processing unit to receive the display data over the internal communications interface and transmit the display data over the external communications interface.

2. The digital oscilloscope of claim 1, wherein the digital signal processing unit's communications interface and the master control unit's internal communications interface are serial peripheral interfaces (SPIs), and the master control unit's external communications interface is a universal serial bus (USB) interface.

3. The digital oscilloscope of claim 1, wherein the plurality of processing blocks includes an A/D samples processing block, a display data processing block and a control logic block, the A/D samples processing block that includes an infinite impulse response (IIR) filter block to filter the digitized analog signal data, a measurement block to process the filtered signal data, an average block to calculate an average signal level from the filtered signal data, an envelope block to detect peaks in the filtered signal data, and a trigger block.

4. The digital oscilloscope of claim 3, wherein the measurement block receives data from the IIR filter block and determines, for a predetermined sample period, instantaneous and average measurement periods, a period glitch, instantaneous and average duty cycles, and a duty cycle glitch.

5. The digital oscilloscope of claim 4, wherein the measurement block sends a trigger pulse to the trigger block if the period glitch or the duty cycle glitch is detected.

6. The digital oscilloscope of claim 4, wherein the period glitch is determined by calculating the difference between the instantaneous and average duty cycle and comparing the difference to a predetermined value.

7. The digital oscilloscope of claim 4, wherein the duty cycle glitch is determined by calculating the difference between the instantaneous and average duty cycles and comparing the difference to a predetermined value.

8. The digital oscilloscope of claim 3, wherein the measurement block calculates minimum, maximum, summation and sum of the squares data, and optionally stores these data in a plurality of registers or a memory, including the synchronous RAM.

9. The digital oscilloscope of claim 8, wherein minimum, maximum, summation and sum of the squares data are calculated over a block of N samples.

10. The digital oscilloscope of claim 9, wherein each sample within the block of N samples is an average of 64 samples received from the IIR filter block.

11. The digital oscilloscope of claim 10, wherein the minimum and maximum data are stored in 16-bit registers, and the summation and sum of the squares data are stored in 32-bit registers.

12. A measurement processing block for a digital oscilloscope, comprising:
   a time measurement processing block, including:
      a detect edges processing block to detect the edges of a filtered, digitized analog signal;
      a measure period processing block, coupled to the detect edges processing block, to measure an instantaneous and average period of the signal;
      a first low pass filter coupled to the measure period processing block;
      a measure duty cycle processing block, coupled to the detect edges processing block, to measure an instantaneous and average duty cycle of the signal;
      a second low pass filter coupled to the measure duty cycle processing block;
      a detect glitches processing block, coupled to the first and second low pass filters, to detect glitches in the period and duty cycle measurements; and
   a voltage measurement processing block, including:
      a pre-average processing block to average a predetermined number of filtered, digitized analog signal samples to create a single block sample, wherein a sample block includes N block samples;
      a minimum processing block to calculate a minimum block sample within the sample block;
      a maximum processing block to calculate a maximum block sample within the sample block;
      a summation processing block to calculate a summation of the sample block; and
      a squared summation processing block to calculate a squared summation of the sample block.

13. The measurement block of claim 12, wherein the detect glitches processing block detects the period glitch by determining a difference between the instantaneous and average periods and comparing the difference to a predetermined value.

14. The measurement block of claim 13, wherein the detect glitches processing block outputs a trigger pulse if the period glitch is detected.

15. The measurement block of claim 12, wherein the detect glitches processing block detects the duty cycle glitch by determining a difference between the instantaneous and average duty cycles and comparing the difference to a predetermined value.

16. The measurement block of claim 15, wherein the detect glitches processing block outputs a trigger pulse if the duty cycle glitch is detected.

17. The measurement block of claim 12, wherein the predetermined number of filtered, digitized analog signal samples is 64.

18. The measurement block of claim 17, wherein the N block samples is set to cover a 100 ms sample period.

19. The measurement block of claim 12, wherein the voltage measurement processing block outputs the minimum, maximum, summation and squared summation for storage in a plurality of registers or a memory.

20. The measurement block of claim 19, wherein the minimum and maximum data are stored in 16-bit registers, and the summation and squared summation data are stored in 32-bit registers.

* * * * *